(12) United States Patent
Alley et al.

(10) Patent No.: US 11,188,493 B2
(45) Date of Patent: Nov. 30, 2021

(54) BUS DECODE AND TRIGGERING ON DIGITAL DOWN CONVERTED DATA IN A TEST AND MEASUREMENT INSTRUMENT

(71) Applicant: Tektronix, Inc., Beaverton, OR (US)

(72) Inventors: James D. Alley, Moro, OR (US); Gary J. Waldo, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 23 days.

(21) Appl. No.: 16/733,613

(22) Filed: Jan. 3, 2020

(65) Prior Publication Data

US 2020/0233827 A1 Jul. 23, 2020

Related U.S. Application Data

(60) Provisional application No. 62/794,528, filed on Jan. 18, 2019.

(51) Int. Cl.
| | |
|---|---|
| *G06F 13/40* | (2006.01) |
| *H04B 1/48* | (2006.01) |
| *H04L 25/49* | (2006.01) |
| *G06F 13/42* | (2006.01) |
| *G01R 13/02* | (2006.01) |
| *G01R 13/34* | (2006.01) |
| *G06F 13/38* | (2006.01) |

(52) U.S. Cl.
CPC ...... *G06F 13/4063* (2013.01); *G06F 13/4282* (2013.01); *H04B 1/48* (2013.01); *H04L 25/4921* (2013.01)

(58) Field of Classification Search
CPC ......... G06F 8/43; G06F 11/36; G06F 13/4063
See application file for complete search history.

(56) References Cited

U.S. PATENT DOCUMENTS

| | | | | |
|---|---|---|---|---|
| 8,869,228 | B1* | 10/2014 | Harvey | H04H 60/40 725/135 |
| 2003/0081768 | A1* | 5/2003 | Caminschi | G06F 21/121 380/2 |
| 2005/0180351 | A1* | 8/2005 | Peric | H04W 48/12 370/328 |
| 2006/0141998 | A1* | 6/2006 | Kennedy, Jr. | H04B 7/0891 455/423 |
| 2013/0303098 | A1* | 11/2013 | Carlsson | H04B 17/336 455/226.1 |
| 2014/0098694 | A1* | 4/2014 | Damji | H04W 52/0229 370/252 |
| 2014/0370884 | A1* | 12/2014 | Kummetz | H04W 24/10 455/423 |
| 2016/0373196 | A1* | 12/2016 | Stott | H04B 7/0452 |

\* cited by examiner

*Primary Examiner* — Getente A Yimer
(74) *Attorney, Agent, or Firm* — Miller Nash LLP; Andrew J. Harrington

(57) ABSTRACT

A test and measurement instrument including a digital down converter configured to receive a bus signal and output in-phase and quadrature-phase baseband component waveform data, a trace generator configured to receive the in-phase and quadrature-phase baseband component waveform data and generate at least one radio frequency versus time trace, a decoder configured to receive the at least one radio frequency versus time trace and decode the bus signal based on the at least one radio frequency versus time trace and a wireless modulation scheme, and a trigger configured to capture at least a portion of the bus signal based on the decoded bus signal.

16 Claims, 3 Drawing Sheets

BUS DECODE AND TRIGGERING ON DIGITAL DOWN CONVERTED DATA IN A TEST AND MEASUREMENT INSTRUMENT

PRIORITY

This disclosure claims benefit of U.S. Provisional Application No. 62/794,528, titled "BUS DECODE AND TRIGGERING ON DIGITAL DOWN CONVERTED DATA IN A TEST AND MEASUREMENT INSTRUMENT," filed on Jan. 18, 2019, which is incorporated herein by reference in its entirety.

FIELD OF THE INVENTION

This disclosure is directed to systems and methods related to test and measurement systems, and in particular, to a test and measurement system for decoding wirelessly received bus data and triggering on the decoded bus data.

BACKGROUND

Traditional test and measurement instruments, such as oscilloscopes, enable a user to decode a serial bus signal. This can be done by probing a serial bus signal, as well as other signals necessary to decode the serial bus signal. Additional information is provided to the oscilloscope, such as information about the serial bus being acquired including what type of bus it is, what each channel is probing, along with various other setup information.

Given the setup information, a traditional oscilloscope is able to decode the actual packet and/or data content that the bus is transmitting and provide that data to the user in the form of a decoded bus display. However, this type of capability is only available for wired serial and parallel bus connections, and is not capable of being done on a signal that has had a wireless modulation scheme applied on a traditional oscilloscope due to the complexities of the wireless modulation schemes.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Figure 1:
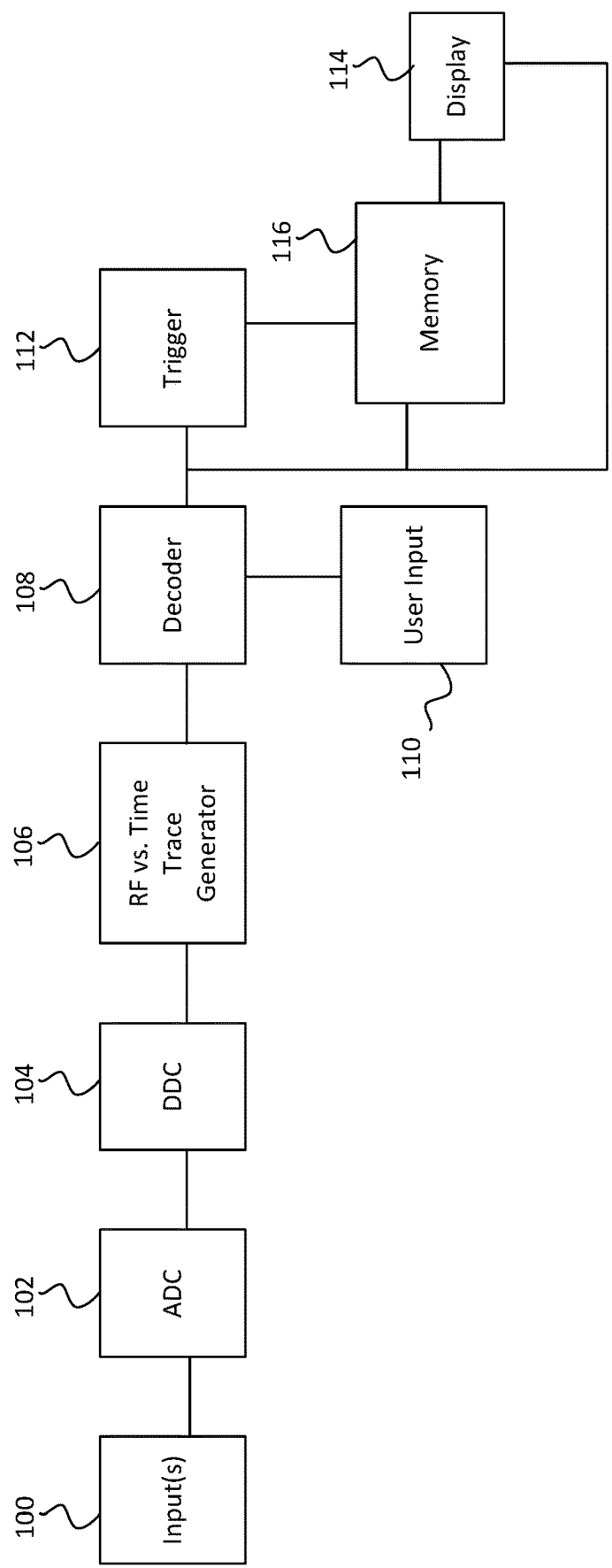
FIG. 1 is a block diagram of a test and measurement instrument according to some embodiments of the disclosure.

FIG. 1 illustrates a block diagram of an example test and measurement instrument, according to some embodiments of the disclosure. The test and measurement instrument can include one or more inputs 100 configured to receive one or more signals. At least one of the one or more inputs 100 receives a signal, such as a bus signal, that has had a wireless modulation scheme applied to the signal. The one or more inputs 100 can receive the signal either through a wired or wireless input.

The test and measurement instrument can include one or more analog to digital converters 102 to convert the input bus signal to a digital bus signal. The digital bus signal can be down converted into its in-phase and quadrature-phase baseband component data by a digital down converter 104.

Further, a trace generator 106 can receive the in-phase (I) and quadrature-phase (Q) baseband component information and derive or generate one or more time-domain traces, which can illustrate how a specific characteristic of the bus signal changes over time. The time-domain traces may include one or more frequency versus time traces and/or in-phase baseband component data versus time and quadrature-phase baseband component data versus time. In some embodiments, a fast Fourier transform can be performed on the in-phase and quadrature-phase baseband components to generate a spectrum view of the time domain data.

The radio frequency versus time traces may include, for example, an amplitude versus time trace, a frequency versus time trace, or a phase versus time trace. In addition, an amplitude versus time trace can include a linear power versus time trace, a log power versus time trace, and/or a linear amplitude versus time trace. The trace generator 106 can generate in-phase baseband component traces and quadrature-phase baseband component traces.

The radio frequency versus time traces are generated using the following equations, where I is the in-phase baseband waveform data determined by the down converter 104 and Q is the quadrature-phase baseband waveform data determined by the down converter 104:

$$I = A \cdot \cos(\phi); \quad (1)$$

$$Q = A \cdot \sin(\phi); \quad (2)$$

$$\text{Peak Amplitude } A = (I^2 + Q^2)^{1/2}; \quad (3)$$

$$\text{Phase Angle } \phi = \tan^{-1}(Q/I); \text{ and} \quad (4)$$

$$\text{Frequency} = (\text{Phase}_{n+1} - \text{Phase}_n)/(360 * 1/SR_D). \quad (5)$$

$SR_D$ in equation (5) is the decimated sample rate of the incoming bus signal.

The one or more time-domain traces generated by the trace generator 106 can be used by a decoder 108 to decode the serial bus signal. The decoder 108 may also receive an input from a user input 110. The user input 110 may be any component that allows a user to enter information into the system, such as, but not limited to, a keyboard, a mouse, a joystick, or any other connected component. The input from the user input 110 may be received wired or wirelessly. The input from the user input 110 can include information about a wireless modulation scheme, such as phase-shift keying, frequency-shift keying, frequency modulation, etc.

The decoder 108 can decode the serial bus signal into decoded data using the one or more traces generated by the trace generator 106 and the user inputs. The decoded data can be, for example, a binary signal. Based on the wireless modulation scheme information received at the user input 110, the decoder 108 can set one or more thresholds to determine a binary signal. In some embodiments, the one or more thresholds are set by the user through the user input 110, rather than being determined by the wireless modulation scheme.

For example, using a frequency versus time trace, a threshold may be set at a specific frequency. Any frequencies above the threshold frequency in the frequency vs time trace is decoded as a binary value of 1, and anything below that frequency is decoded as a binary value of 0. However, thresholds can bet set based on the phases, amplitudes, etc. of the signals, depending on the wireless modulation scheme and thresholds identified by the user, and are not limited only to frequencies.

In some embodiments, more than one threshold may be set. For example, if three thresholds are used, any value below both thresholds may be decoded at 00, any value between the first threshold and the second threshold may be decoded as 01, any value between the second threshold and the third threshold may be decoded as 10, and any values above the third threshold may be decoded as 11. Embodiments of the disclosure are not limited to a single threshold and any number of thresholds may be used, as required based on an input from a user.

A trigger 112 can search the decoded data for a particular binary pattern, and then trigger the capture of the decoded data when the particular binary pattern is detected. The particular binary pattern to use as a trigger may be selected by a user through the user input 110. Once the decoded data is captured, the test and measurement instrument may then further process the data, such as performing additional measurements and analysis, or displaying data on the display 114, or the trigger 112 may instruct a memory 116 to store the decoded data.

Figure 2:
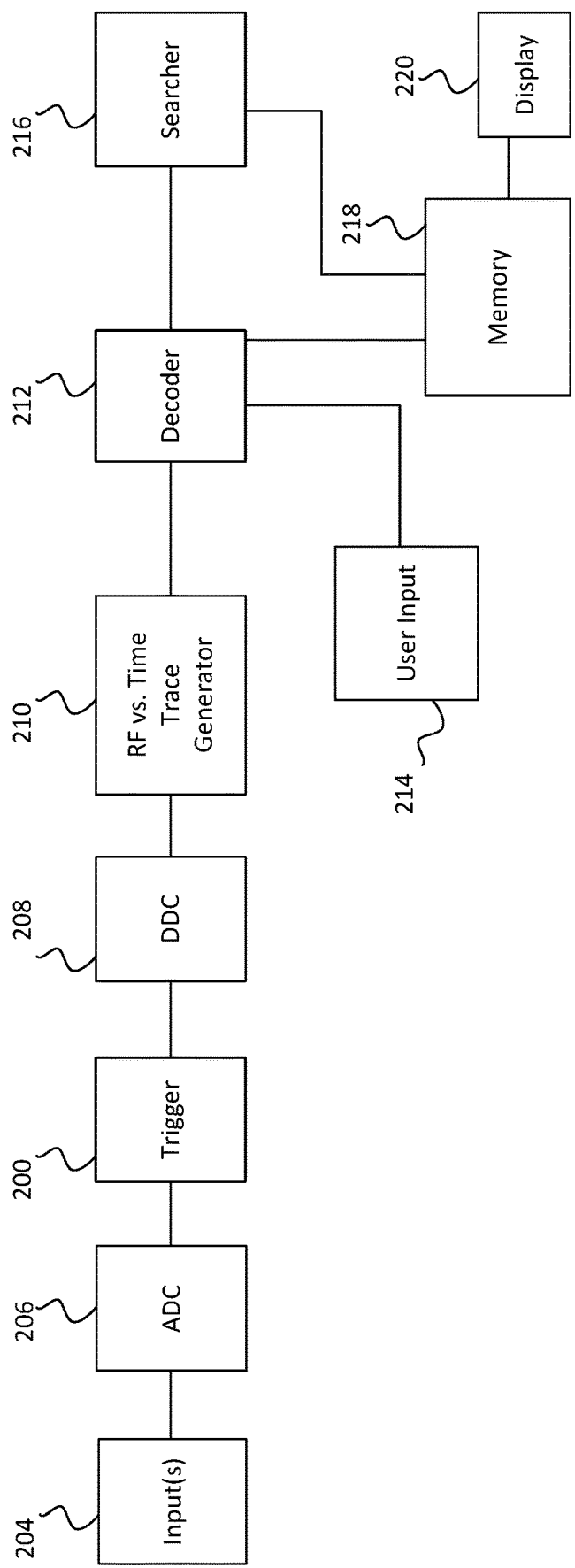
FIG. 2 is a block diagram of another test and measurement instrument according to other embodiments of the disclosure.

Similar to FIG. 1, the test and measurement instrument of FIG. 2 may include one or more inputs 200 to receive a modulated bus signal that has been modulated based on a wireless modulation scheme. The modulated bus signal may be digitized through analog to digital converter 202. Trigger 204 may include, for example, a hardware trigger that can be configured to trigger on an edge of the input signal or of a clock signal. When the trigger 204 detects an edge, the modulated bus signal can be captured. In some embodiments, trigger 204 may trigger upon a detection of a radio frequency signal.

Similar to that discussed above with respect to FIG. 1, the digitized signal can be down converted into its in-phase (I) and quadrature-phase (Q) baseband component data in a digital down converter 206.

A trace generator 208 is similar to trace generator 106 and can receive the in-phase and quadrature-phase baseband component waveform data and derive one or more time-domain traces, as mentioned above, which can illustrate how a specific characteristic of the bus signal changes over time, such as discussed above with respect to trace generator 106.

The one or more time-domain traces generated by the trace generator 208 can be used by a decoder 210 to decode the serial bus signal, which can receive an input from a user input 212, similar to user input 110.

Similar to discussed above, the decoder 210 can then decode the modulated serial bus signal into decoded data using the one or more traces generated by the trace generator 208 and the user inputs. The decoded data can be, for example, a binary signal. The decoded data can be sent to a searcher 214 which can search for a particular binary pattern. As mentioned above, the particular binary pattern may be provided by a user in the user inputs 212. If the particular binary pattern is found in the captured waveform, then the searcher 214 may accept the waveform and transmit the waveform for storage in memory 216, to display 218, or to some other component, such as one or more processors, for further processing. However, if the particular binary pattern is not found in the captured waveform, then the captured waveform is rejected by the searcher 214 and not stored.

In some embodiments, the down converter 206, the trace generator 208, the decoder 210, and the searcher 214 may each be included in one or more processors (not shown). The one or more processors may store instructions, such as in memory 216, to perform the functions discussed above for the down converter 206, trace generator 208, decoder 210, and searcher 214.

Figure 3:
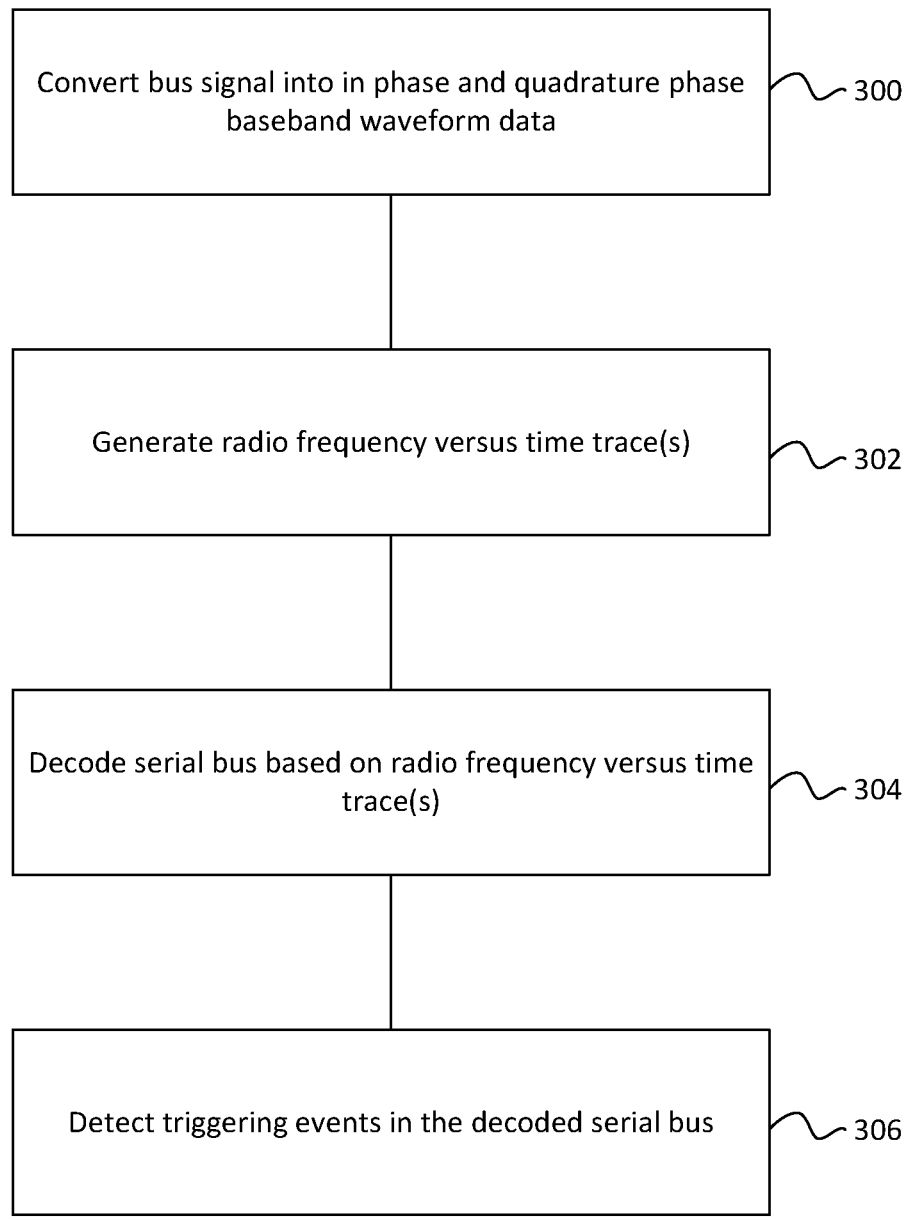
FIG. 3 is a flow chart for decoding of a wirelessly received bus signal according to embodiments of the disclosure.

FIG. 3 illustrates a flow chart for decoding a bus signal that has been modulated based on a wireless modulation scheme using either one of the embodiments shown in FIGS. 1 and 2.

Initially, in operation 300, a modulated bus signal that has been digitized is down-converted into in-phase (I) and quadrature-phase (Q) baseband component waveform data. In operation 302, using the in-phase and quadrature-phase baseband component waveform data, one or more time-domain traces may be generated. For example, as mentioned above, the one or more radio frequency versus time traces may include frequency versus time, phase versus time, or amplitude versus time. The time-domain traces may also include in-phase and quadrature-phase baseband component information versus time traces.

Using a received wireless modulation scheme, operation 304 decodes the modulated bus signal based on time-domain traces generated in operation 302. For example, one or more thresholds may be set for the time-domain traces to decode the bus signal into a binary signal. For the radio frequency versus time traces, the thresholds may be frequency, phase, or amplitude thresholds that are compared to the traces to determine whether to decode the bus signal into binary components.

When the bus signal is decoded, in operation 306, a capturing device, such as either the trigger 112 or the searcher 214, can determine whether one or more triggering events are in the decoded signal. For example, the trigger 112 or the searcher 214 may determine whether a particular bit stream exists in the decoded signal. If the triggering event is present, then the decoded bus signal may be captured and either stored in memory, displayed, or processed further by the test and measurement instrument, as shown in FIGS. 1 and 2, and as discussed above. In the embodiment of FIG. 2, if the searcher 214 does not locate the triggering event, then the searcher 214 may discard the decoded bus signal.

In each of the embodiments discussed above, the decoding of the bus signal may continue on a periodic or continuous basis. That is, a large portion of the bus signal may be captured and then decoded, or the bus signal may be continually decoded and analyzed for a triggering event as it is received.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a test and measurement instrument, comprising a digital down converter configured to receive a modulated bus signal that has been modulated based on a wireless modulation scheme and output in-phase and quadrature-phase baseband component waveform data; a trace generator configured to receive the in phase and quadrature phase baseband component waveform data and generate one or more traces, the one or more traces including a radio frequency versus time trace or in-phase and quadrature-phase versus time traces; a decoder configured to decode the modulated bus signal based on the one or more traces and a wireless modulation scheme; and a capturing device configured to capture the modulated bus signal based on the decoded bus signal.

Example 2 is the test and measurement instrument of example 1, wherein the decoder is configured to decode the bus signal based on the one or more traces by determining at least one threshold and decoding the bus signal into a binary signal by comparing the one or more traces to the at least one threshold.

Example 3 is the test and measurement instrument of example 2, further comprising a user input configured to receive the at least one threshold.

Example 4 is the test and measurement instrument of example 3, wherein the at least one threshold is determined based on the wireless modulation scheme.

Example 5 is the test and measurement instrument of any one of examples 1-4, wherein the capture device includes one or more processors configured to receive the decoded bus signal, to search for a triggering event in the decoded bus signal, to reject the modulated bus signal and capture a new modulated bus signal if the triggering event does not occur in the decoded bus signal, and to capture the modulated bus signal if the triggering event occurs in the decoded bus signal.

Example 6 is the test and measurement instrument of any one of examples 1-5, wherein the radio frequency versus time trace includes at least one of amplitude versus time trace, frequency versus time trace, and phase versus time trace.

Example 7 is the test and measurement instrument of example 6, wherein the amplitude versus time trace includes at least one of linear power versus time trace, log power versus time trace, and linear amplitude versus time trace.

Example 8 is the test and measurement instrument of any one of examples 1-7, wherein the capture device is further configured to detect whether an event is present in the decoded bus signal and capture the modulated bus signal when the event is detected.

Example 9 is a method for decoding a wirelessly received bus signal, comprising down-converting a bus signal into in-phase and quadrature-phase baseband component waveform data; generating at least one time-domain trace based on the in-phase and quadrature-phase baseband component waveform data; decoding the bus signal into decoded data based on the at least one time-domain trace and a wireless modulation scheme; detecting an event in the decoded bus signal; and capturing at least a portion of the decoded bus signal when the event is detected.

Example 10 is the method of example 9, wherein decoding the bus signal includes determining at least one threshold and decoding the bus signal into a binary signal by comparing the at least onetime-domain trace to the at least one threshold.

Example 11 is the method of example 10, further comprising receiving the at least one threshold from a user input.

Example 12 is the method of example 11, wherein the at least one threshold is determined based on the wireless modulation scheme.

Example 13 is the method of any one of examples 9-12, further comprising rejecting the portion of the decoded bus signal and capturing a new bus signal if the event is not detected.

Example 14 is the method of any one of examples 9-13, wherein the at least one time-domain trace includes a radio frequency versus time trace including an amplitude versus time trace, a frequency versus time trace, and a phase versus time trace.

Example 15 is the method of example 14, wherein the amplitude versus time trace includes at least one of linear power versus time trace, log power versus time trace, and linear amplitude versus time trace.

Example 16 is one or more computer-readable storage media comprising instructions, which, when executed by one or more processors of a test and measurement instrument, cause the test and measurement instrument to down-convert a bus signal received wirelessly into in-phase and quadrature-phase baseband component waveform data; generate at least one trace based on the in-phase and quadrature-phase baseband component waveform data; decode the bus signal into decoded data based on the trace and a wireless modulation scheme; determine whether an event is in the decoded bus signal; and store the decoded bus signal when the event is detected and reject the decoded bus signal when the event is not detected.

Example 17 is the one or more computer-readable storage media of example 16, wherein decoding the bus signal includes determining at least one threshold and decoding the bus signal into a binary signal by comparing the trace to the at least one threshold.

Example 18 is the one or more computer-readable storage media of either one of examples 16 or 17, wherein the at least one trace includes at least one of amplitude versus time trace, frequency versus time trace, phase versus time trace, in-phase baseband component versus time trace, and quadrature-phase baseband component versus time trace.

Example 19 is the one or more computer-readable storage media of example 18, wherein the amplitude versus time trace includes at least one of linear power versus time trace, log power versus time trace, and linear amplitude versus time trace.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A test and measurement instrument, comprising:
   a digital down converter configured to receive a modulated bus signal that has been modulated based on a wireless modulation scheme and output in-phase and quadrature-phase baseband component waveform data;
   a trace generator configured to receive the in phase and quadrature phase baseband component waveform data and generate one or more traces, the one or more traces including a radio frequency versus time trace or in-phase and quadrature-phase versus time traces;
   a decoder configured to decode the modulated bus signal based on the one or more traces and a wireless modulation scheme; and
   a capturing device configured to capture the modulated bus signal based on the decoded bus signal,
   wherein the decoder is configured to decode the bus signal based on the one or more traces by determining at least one threshold and decoding the bus signal into a binary signal by comparing the one or more traces to the at least one threshold.

2. The test and measurement instrument of claim 1, further comprising a user input configured to receive the at least one threshold.

3. The test and measurement instrument of claim 1, wherein the at least one threshold is determined based on the wireless modulation scheme.

4. The test and measurement instrument of claim 1, wherein the capture device includes one or more processors configured to receive the decoded bus signal, to search for a triggering event in the decoded bus signal, to reject the modulated bus signal and capture a new modulated bus signal if the triggering event does not occur in the decoded bus signal, and to capture the modulated bus signal if the triggering event occurs in the decoded bus signal.

5. The test and measurement instrument of claim 1, wherein the radio frequency versus time trace includes at least one of amplitude versus time trace, frequency versus time trace, and phase versus time trace.

6. The test and measurement instrument of claim 5, wherein the amplitude versus time trace includes at least one of linear power versus time trace, log power versus time trace, and linear amplitude versus time trace.

7. The test and measurement instrument of claim 1, wherein the capture device is further configured to detect whether an event is present in the decoded bus signal and capture the modulated bus signal when the event is detected.

8. A method for decoding a wirelessly received bus signal, comprising:
   down-converting a bus signal into in-phase and quadrature-phase baseband component waveform data;
   generating at least one time-domain trace based on the in-phase and quadrature-phase baseband component waveform data;
   decoding the bus signal into decoded data based on the at least one time-domain trace and a wireless modulation scheme;
   detecting an event in the decoded bus signal; and
   capturing at least a portion of the decoded bus signal when the event is detected,
   wherein decoding the bus signal includes determining at least one threshold and decoding the bus signal into a binary signal by comparing the at least one time-domain trace to the at least one threshold.

9. The method of claim 8, further comprising receiving the at least one threshold from a user input.

10. The method of claim 8, wherein the at least one threshold is determined based on the wireless modulation scheme.

11. The method of claim 8, further comprising rejecting the portion of the decoded bus signal and capturing a new bus signal if the event is not detected.

12. The method of claim 8, wherein the at least one time-domain trace includes a radio frequency versus time trace including an amplitude versus time trace, a frequency versus time trace, and a phase versus time trace.

13. The method of claim 12, wherein the amplitude versus time trace includes at least one of linear power versus time trace, log power versus time trace, and linear amplitude versus time trace.

14. One or more computer-readable storage media comprising instructions, which, when executed by one or more processors of a test and measurement instrument, cause the test and measurement instrument to:
- down-convert a bus signal received wirelessly into in-phase and quadrature-phase baseband component waveform data;
- generate at least one trace based on the in-phase and quadrature-phase baseband component waveform data;
- decode the bus signal into decoded data based on the trace and a wireless modulation scheme;
- determine whether an event is in the decoded bus signal; and
- store the decoded bus signal when the event is detected and reject the decoded bus signal when the event is not detected,
- wherein decoding the bus signal includes determining at least one threshold and decoding the bus signal into a binary signal by comparing the trace to the at least one threshold.

15. The one or more computer-readable storage media of claim 14, wherein the at least one trace includes at least one of amplitude versus time trace, frequency versus time trace, phase versus time trace, in-phase baseband component versus time trace, and quadrature-phase baseband component versus time trace.

16. The one or more computer-readable storage media of claim 15, wherein the amplitude versus time trace includes at least one of linear power versus time trace, log power versus time trace, and linear amplitude versus time trace.

* * * * *